(12) United States Patent
Kusukawa

(10) Patent No.: US 9,917,135 B2
(45) Date of Patent: Mar. 13, 2018

(54) METHOD OF MANUFACTURING SOLID-STATE IMAGE SENSOR

(71) Applicant: CANON KABUSHIKI KAISHA, Tokyo (JP)

(72) Inventor: Masashi Kusukawa, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/455,343

(22) Filed: Mar. 10, 2017

(65) Prior Publication Data
US 2017/0287974 A1    Oct. 5, 2017

(30) Foreign Application Priority Data

Mar. 31, 2016 (JP) .................. 2016-073178

(51) Int. Cl.
| | |
|---|---|
| *H01L 21/336* | (2006.01) |
| *H01L 27/146* | (2006.01) |
| *H01L 21/3213* | (2006.01) |
| *H01L 21/311* | (2006.01) |
| *H01L 21/02* | (2006.01) |
| *H01L 29/45* | (2006.01) |
| *H01L 29/66* | (2006.01) |

(52) U.S. Cl.
CPC .... *H01L 27/14689* (2013.01); *H01L 21/0217* (2013.01); *H01L 21/02211* (2013.01); *H01L 21/31116* (2013.01); *H01L 21/32133* (2013.01); *H01L 27/14614* (2013.01); *H01L 29/45* (2013.01); *H01L 29/665* (2013.01)

(58) Field of Classification Search
CPC ......... H01L 27/14612; H01L 27/14614; H01L 27/14689

USPC ......................................................... 438/299
See application file for complete search history.

(56) References Cited

U.S. PATENT DOCUMENTS

| | | | |
|---|---|---|---|
| 8,093,635 B2 | 1/2012 | Kido et al. | |
| 8,097,486 B2 | 1/2012 | Kido et al. | |
| 2006/0113623 A1* | 6/2006 | Park | H01L 27/14643 257/444 |
| 2015/0325609 A1* | 11/2015 | Ishino | H01L 21/7685 257/288 |

(Continued)

FOREIGN PATENT DOCUMENTS

| | | |
|---|---|---|
| JP | 2007-324306 A | 12/2007 |
| JP | 2008-252032 A | 10/2008 |

*Primary Examiner* — David S Blum
(74) *Attorney, Agent, or Firm* — Fitzpatrick, Cella, Harper & Scinto

(57) ABSTRACT

A method of manufacturing a solid-state image sensor is provided. The method comprises: depositing a gate electrode film above the semiconductor layer; etching the gate electrode film to form a first gate electrode patterned in a pixel region, leaving the gate electrode film in a peripheral region; depositing a first insulating film above the semiconductor layer after the forming the first gate electrode; removing the first insulating film formed in the peripheral region; etching the gate electrode film left in the peripheral region to form a second gate electrode patterned in the peripheral region after the removing the first insulating film; forming a second insulating film above the semiconductor layer after the forming the second gate electrode; and forming a side wall on side surface of the second gate electrode by etching the second insulating film.

20 Claims, 4 Drawing Sheets

(56) References Cited

U.S. PATENT DOCUMENTS

2015/0364522 A1* 12/2015 Itahashi ............ H01L 27/14689
                                                                            438/59

* cited by examiner

US 9,917,135 B2

METHOD OF MANUFACTURING SOLID-STATE IMAGE SENSOR

BACKGROUND OF THE INVENTION

Field of the Invention

The present invention relates to a method of manufacturing a solid-state image sensor.

Description of the Related Art

In a solid-state image sensor, an interface state (dangling bond) formed at the interface between a semiconductor substrate and an insulating film that contacts the semiconductor substrate is one cause of noise such as a white defect or a dark current in a pixel region. In order to reduce the noise caused by this dangling bond, Japanese Patent Laid-Open No. 2008-252032 describes a technique of arranging a hydrogen supply film above a pixel region and terminating a dangling bond on the surface of a light-receiving element such as a photodiode formed in the pixel region by hydrogen supplied from the hydrogen supply film. In a manufacturing method in Japanese Patent Laid-Open No. 2008-252032, gate electrodes are formed in respective portions serving as the pixel region and a peripheral circuit region on a substrate, and then an insulating film is formed so as to cover the substrate, and side walls are formed on the side surfaces of the gate electrodes by etching back this insulating film. Then, the hydrogen supply film is formed so as to cover the substrate, and a portion arranged above the peripheral circuit region is removed by etching while a portion of the hydrogen supply film arranged above the pixel region is left. Hydrogen can be supplied to the light-receiving element in the pixel region by the hydrogen supply film arranged above the pixel region.

SUMMARY OF THE INVENTION

In a manufacturing method described in Japanese Patent Laid-Open No. 2008-252032, damage such as plasma damage may be caused to a semiconductor layer in dry etching for forming gate electrodes, removing a portion of a hydrogen supply film arranged above a peripheral circuit region, or the like. If the damage is caused to the semiconductor layer in the peripheral circuit region, a characteristic variation such as an increase in a junction leakage of a transistor arranged in the peripheral circuit region may occur in the transistor. The characteristic variation in the transistor can be a factor for decreasing a yield when a solid-state image sensor is manufactured.

Some embodiments of the present invention provide a technique advantageous in suppressing the characteristic variation in the transistor arranged in the peripheral circuit region in the solid-state image sensor.

According to some embodiments, a method of manufacturing a solid-state image sensor with a pixel region and a peripheral circuit region being arranged in a semiconductor layer, the method comprising: depositing a gate electrode film above the semiconductor layer; etching the gate electrode film to form a first gate electrode patterned in the pixel region, leaving the gate electrode film in the peripheral circuit region; depositing a first insulating film above the semiconductor layer after the forming the first gate electrode; removing the first insulating film formed in the peripheral circuit region; etching the gate electrode film left in the peripheral circuit region to form a second gate electrode patterned in the peripheral circuit region after the removing the first insulating film; forming a second insulating film above the semiconductor layer after the forming the second gate electrode; and forming a side wall on side surface of the second gate electrode by etching the second insulating film, is provided.

Further features of the present invention will become apparent from the following description of exemplary embodiments (with reference to the attached drawings).

DESCRIPTION OF THE EMBODIMENTS

Figure 1A:
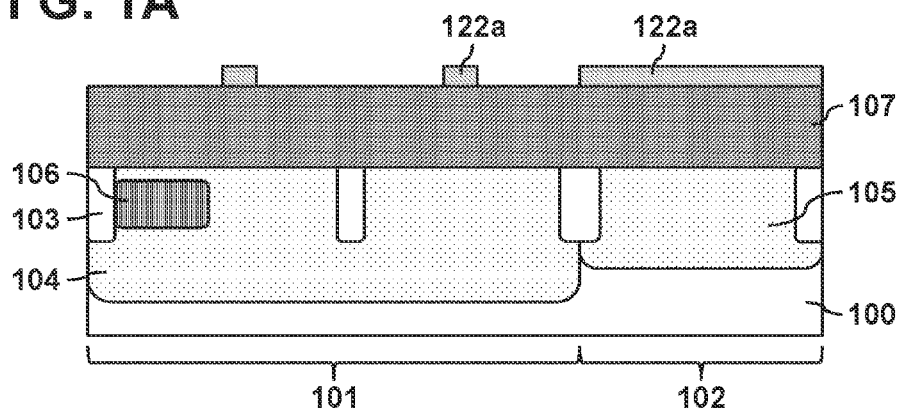
FIGS. 1A to 1F are sectional views showing a method of manufacturing a solid-state image sensor according to the present invention.

A practical embodiment of a solid-state image sensor of the present invention will be described below with reference to the accompanying drawings. Note that in a description and the drawings below, common reference numerals denote common arrangements throughout the plurality of drawings. Therefore, the common arrangements will be described by referring to the plurality of drawings mutually, and descriptions of the arrangements denoted by the common reference numerals will be omitted as needed.

The structure and a manufacturing method of a solid-state image sensor according to an embodiment of the present invention will be described with reference to FIGS. 1A to 1F and 2A to 2E. FIGS. 1A to 1F and 2A to 2E are sectional views each showing a step of the method of manufacturing the solid-state image sensor according to the embodiment of the present invention. For a descriptive purpose, FIGS. 1A to 1F and 2A to 2E illustrate a pixel region 101 and a peripheral circuit region 102 adjacent to each other. A semiconductor layer 100 in which the solid-state image sensor is formed will be described as a semiconductor region having an n conductivity type. However, conductivity types such as the conductivity types of respective constituent elements to be described below may be opposite from each other.

The solid-state image sensor is formed in and on the semiconductor layer 100. The semiconductor layer 100 may be an n-type semiconductor substrate of silicon or the like or may be an n-type well provided in a semiconductor substrate. Alternatively, the semiconductor layer 100 may be, for example, an n-type semiconductor layer provided on an insulating substrate of glass, a plastic, or the like.

First, an element isolation region 103 formed by an STI, a local oxidation of silicon (LOCOS) method, or the like, and p-type wells 104 and 105 formed in the pixel region 101 and the peripheral circuit region 102 are arranged in the semiconductor layer 100 as shown in FIG. 1A. An n-type semiconductor region 106 is arranged in the pixel region 101. The semiconductor region 106 forms a p-n junction with the well 104 and functions as a photoelectric conversion portion. After the element isolation region 103, the wells 104 and 105, and the semiconductor region 106 are formed, a gate insulating film (not shown) and a polysilicon film 107 serving as a gate electrode film for forming a gate electrode are deposited on the semiconductor layer 100. The element isolation region 103, the wells 104 and 105, the semiconductor region 106, the gate insulating film, and the polysilicon film 107 can be formed by known manufacturing methods.

Figure 1B:
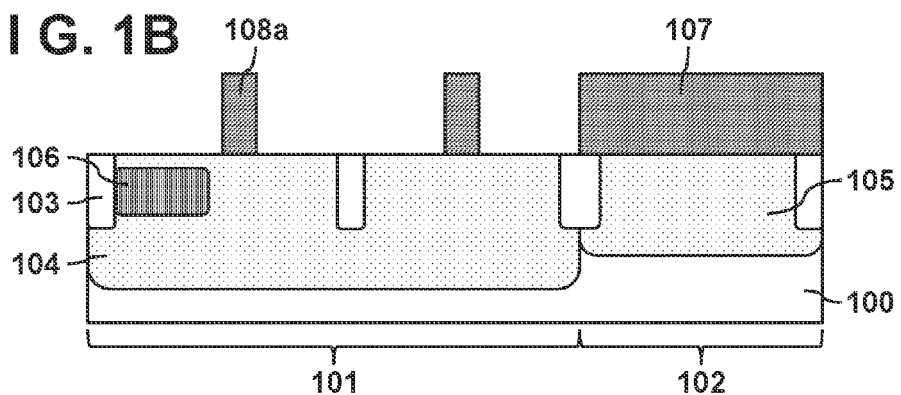

After the polysilicon film 107 is formed, a mask pattern 122a is formed which covers, of the polysilicon film 107, a portion serving as gate electrodes in the pixel region 101 and a portion arranged above the peripheral circuit region 102 as shown in FIG. 1A. For example, a photoresist or the like is used for the mask pattern 122a. Then, the polysilicon film 107 is dry etched through opening portions that are not covered with the formed mask pattern 122a, forming a gate electrode 108a of a transistor patterned in the pixel region 101 as shown in FIG. 1B. With this step, the polysilicon film 107 in the peripheral circuit region 102 is left without being processed, and the gate electrode 108a of the transistor in the pixel region 101 is formed. The peripheral circuit region 102 is covered with the polysilicon film 107 and the mask pattern, making it possible to suppress plasma damage to the semiconductor layer 100 in the peripheral circuit region 102 by dry etching. Not only the photoresist but also a hard mask using an insulating film of silicon oxide or the like may be used for the mask pattern when this dry etching is performed. After dry etching, the mask pattern 122a may be removed or left. If the mask pattern 122a is left in the peripheral circuit region 102, it is possible to suppress the entry of damage in a subsequent ion implantation step into the semiconductor layer 100.

Figure 1C:
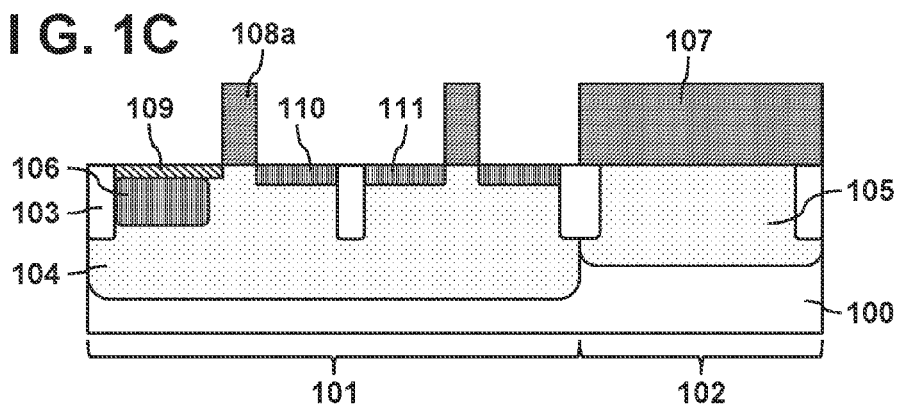

Then, as shown in FIG. 1C, an n-type semiconductor region 110 serving as a floating diffusion portion and an n-type semiconductor region 111 serving as a source/drain region of the transistor in the pixel region 101 are formed by implanting an impurity by an ion implantation method. A p-type semiconductor region 109 may also be formed, by the ion implantation method, in a region shallower than the semiconductor region 106 such that the semiconductor region 106 has a buried structure as in an arrangement shown in FIG. 1C. An order in which the semiconductor regions 109, 110, and 111 are formed is not limited to the above-described order, but they can be formed as appropriate. Further, the semiconductor region 106 may be formed not before the polysilicon film 107 is deposited but after the gate electrode 108a is formed. Even if the mask pattern 122a is removed before the ion implantation step, damage caused by ion bombardment when the impurity is implanted is suppressed because the peripheral circuit region 102 is covered with the polysilicon film 107. After the semiconductor regions 109, 110, and 111 are formed, annealing at a temperature of about 700° C. to 1,100° C. may be performed in order to recover from an implantation failure by ion implantation.

After the semiconductor regions 109, 110, and 111 are formed, an insulating film 112 is deposited above the semiconductor layer 100 so as to cover the pixel region 101 and the peripheral circuit region 102. In this embodiment, the insulating film 112 includes a silicon oxide film 112a and a silicon nitride film 112b arranged on the silicon oxide film 112a. The silicon oxide film 112a is formed by, for example, a low pressure CVD method using a material that contains tetraethoxysilane (TEOS). The silicon nitride film 112b is formed by, for example, a plasma CVD method using materials that contain dichlorosilane and hexachlorodisilane. Silicon nitride formed by the plasma CVD method using these materials can function as a hydrogen supply film containing much hydrogen in a film. It is possible, by forming the insulating film 112 including the silicon nitride film 112b above the pixel region 101, to supply hydrogen from the silicon nitride film 112b to a dangling bond generated in the pixel region 101 and to terminate the dangling bond with hydrogen. This makes it possible to reduce noise generated in the photoelectric conversion portion and the transistor of the pixel region 101. In this embodiment, the silicon nitride film 112b is formed by the plasma CVD method. However, it may be formed by the low pressure CVD method. Furthermore, in this embodiment, the insulating film 112 has a stacked structure of two layers of the silicon oxide film 112a and the silicon nitride film 112b. However, it may have, for example, a three-layered structure in which a silicon oxide film is further arranged on the silicon nitride film 112b.

Figure 1D:
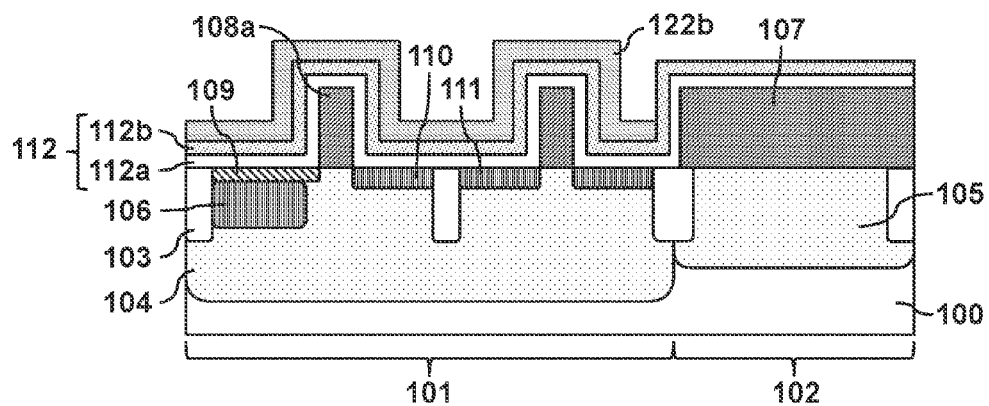

Then, after the insulating film 112 is formed, a mask pattern 122b is formed which covers at least the photoelectric conversion portion formed in the semiconductor region 106 of the insulating film 112 arranged in the pixel region 101, as shown in FIG. 1D. In this embodiment, the mask pattern 122b is formed which entirely covers a portion of the insulating film 112 arranged above the pixel region 101. Then, the insulating film 112 including the silicon oxide film 112a and the silicon nitride film 112b is etched through opening portions that are not covered with the formed mask pattern 122b. The insulating film 112 formed in the peripheral circuit region is removed by this etching. The silicon oxide film 112a and the silicon nitride film 112b may be etched by dry etching. Alternatively, after the silicon nitride film 112b is removed by isotropic dry etching, the silicon oxide film 112a may be removed by wet etching. By combining dry etching and wet etching, the insulating film 112 can be removed without forming side walls by the insulating film 112 on the side surfaces of the polysilicon film above the peripheral circuit region 102. In this embodiment, by the mask pattern 122b which covers the entire pixel region 101, the insulating film 112 is left so as to cover the entire pixel region 101.

In a step of etching the insulating film 112 above this peripheral circuit region 102, the pixel region 101 is covered with the mask pattern 122b and the insulating film 112. This makes it possible to suppress the plasma damage to the semiconductor layer 100 in the pixel region 101 by dry etching. The insulating film 112 also is left above the pixel region 101 even after the mask pattern 122b is removed by ashing or the like, and the mask pattern 122b is removed. This makes it possible to suppress damage to the semiconductor layer 100 in the pixel region 101 caused by a step performed after a step of depositing the insulating film 112, for example, a step such as ion implantation, dry etching, or ashing for forming the respective constituent elements in the peripheral circuit region 102. As a result, it is possible to suppress the noise generated in the photoelectric conversion portion in the pixel region 101 or the characteristic variation in the transistor. The photoelectric conversion portion is covered with the insulating film 112 in subsequent steps even if the mask pattern 122b covers only a portion of the pixel region 101 above the photoelectric conversion portion, making it possible to suppress the noise generated in the photoelectric conversion portion.

In a step of etching the insulating film 112 above the peripheral circuit region 102, the peripheral circuit region 102 is covered with the polysilicon film 107. This makes it possible to reduce the plasma damage to the semiconductor layer 100 in the peripheral circuit region 102 by dry etching as in the pixel region 101.

Figure 1E:
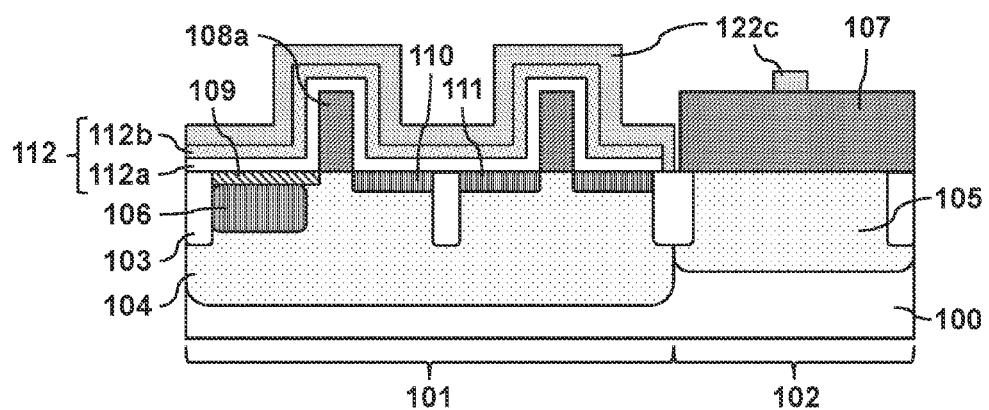

In this embodiment, the insulating film 112 on the polysilicon film 107 is removed completely as shown in FIG. 1E. However, the present invention is not limited to this. For example, the insulating film 112 may be left partially in order to use it as a hard mask when a gate electrode of the transistor in the peripheral circuit region 102 to be described next is formed. Also, for example, before the gate electrode of the transistor in the peripheral circuit region 102 is formed after the insulating film 112 is removed, the polysilicon film 107 may be etched in order to reduce the height of the gate electrode to be formed.

Figure 1F:
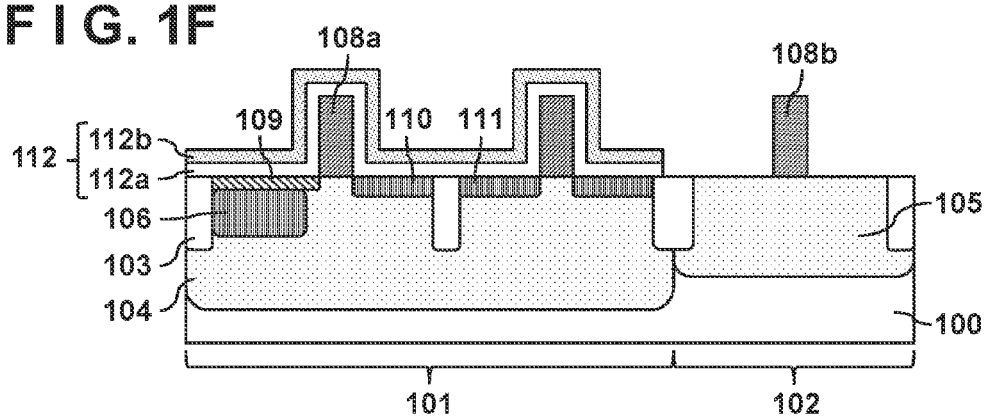

After the insulating film 112 on the polysilicon film 107 is etched, a mask pattern 122c is formed which covers at least a portion, of the polysilicon film 107 that is still left after the gate electrode 108a is formed, serving as the gate electrode in the peripheral circuit region 102 as shown in FIG. 1E. In this case, the mask pattern 122c may cover above the pixel region 101. For example, as shown in FIG. 1E, the mask pattern 122c may entirely cover above the pixel region 101. Alternatively, for example, the mask pattern 122c may cover at least the photoelectric conversion portion including the semiconductor region 106 of the pixel region 101. A region covered with the mask pattern 122c can be decided appropriately in accordance with a condition on which the polysilicon film 107 is etched. Then, the polysilicon film 107 left in the peripheral circuit region 102 is dry etched through opening portions that are not covered with the mask pattern 122c, forming a gate electrode 108b of the transistor patterned in the peripheral circuit region 102. As described above, the insulating film 112 protects the pixel region 101 from the plasma damage or the like in this etching step. FIG. 1F is the sectional view showing the gate electrode 108b formed.

Figure 2A:
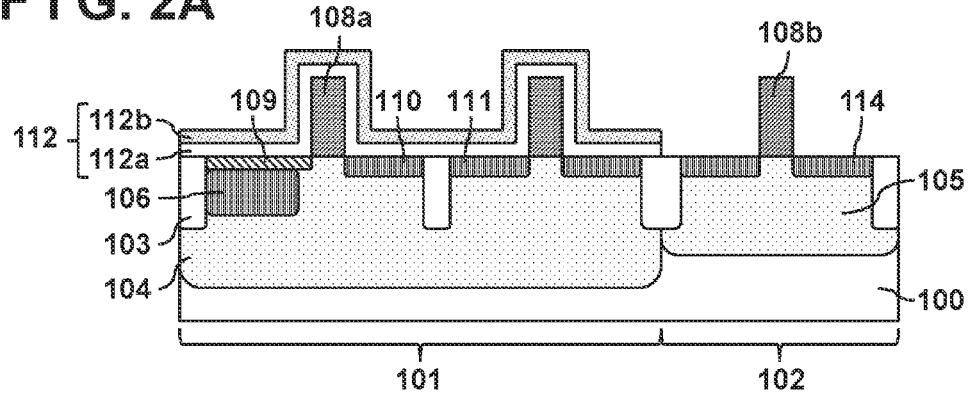
FIGS. 2A to 2E are sectional views showing the method of manufacturing the solid-state image sensor according to the present invention.

After the gate electrode 108b is formed, n-type semiconductor regions 114 are formed which use the gate electrode 108b as a mask and forms source/drain regions of the transistor in the peripheral circuit region 102 in a portion adjacent to the gate electrode 108b as shown in FIG. 2A. The semiconductor region 114 is formed by, for example, implanting an impurity by the ion implantation method. An arrangement shown in FIG. 2A shows only an n-type transistor. However, for example, a p-type transistor with an n-type well being formed in the semiconductor layer 100 and source/drain regions being formed by p-type semiconductor regions can also be formed in the peripheral circuit region 102.

Figure 2B:
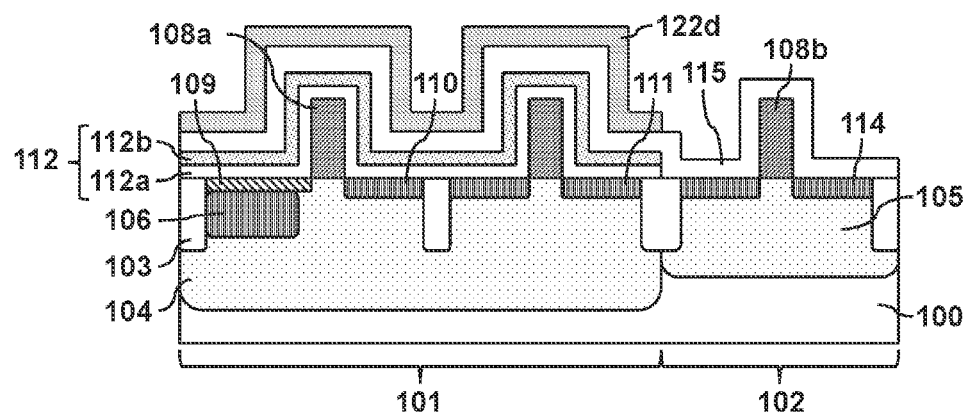

Then, an insulating film 115 serving as side walls of the gate electrode 108b in a subsequent step is deposited above the semiconductor layer 100 so as to cover the pixel region 101 and the peripheral circuit region 102 as shown in FIG. 2B. In this embodiment, the silicon oxide film which is formed by, for example, the low pressure CVD method using the material containing TEOS is used for the insulating film 115. When the insulating film 115 is formed, deposition may be performed at a temperature lower than that of the silicon oxide film 112a which is formed by the low pressure CVD method using the material containing TEOS in order to suppress diffusion of the impurity implanted into the semiconductor region 114.

Figure 2C:
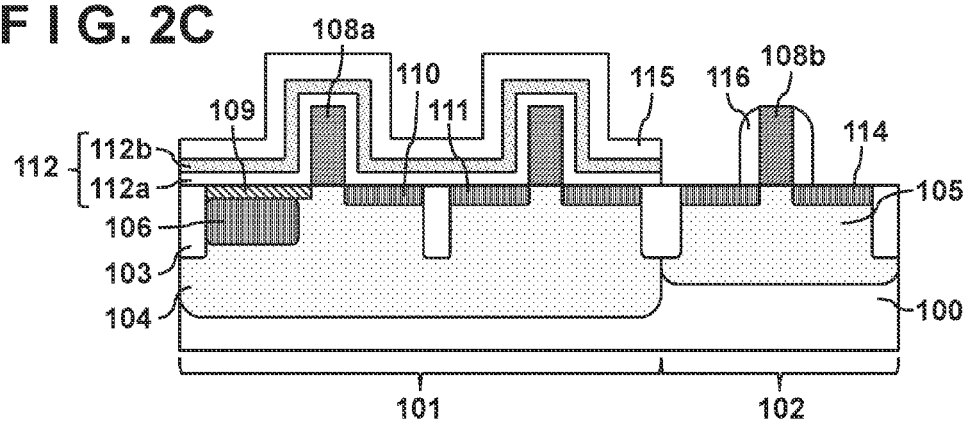

After the insulating film 115 is formed, a mask pattern 122d is formed which covers the insulating film 115 arranged above the pixel region 101, and the insulating film 115 arranged above the peripheral circuit region 102 is etched back by dry etching. By this etchback step, side walls 116 are formed which cover the side surfaces of the gate electrode 108b from the insulating film 115 in a state in which the insulating film 115 partially left on the insulating film 112 in the pixel region 101 as shown in FIG. 2C. It is possible, by leaving a portion of the insulating film 115 arranged above the pixel region 101, to use the insulating film 115 as a silicide protection film when a metal silicide layer is formed on the surface of the semiconductor region 114 or the gate electrode 108b in the peripheral circuit region 102 in a subsequent step. After the side walls 116 are formed, the insulating film 115 may cover the entire pixel region 101.

As in an arrangement shown in FIG. 2C, the insulating film 112 includes the silicon nitride film 112b serving as an insulator different from silicon oxide that forms the side walls 116. Note that a hydrogen concentration of the insulating film 112 may be higher than a hydrogen concentration of the side walls 116. The silicon oxide film used for the insulating film 115 to form the side walls 116 can be lower than the silicon nitride film 112b that forms the insulating film 112 in concentration of hydrogen contained in the film. When the insulating film 115 is deposited, the insulating film 115 may be formed by selecting, as needed, a condition on which the insulating film 115 becomes lower than the insulating film 112 in hydrogen concentration. Note that the hydrogen concentrations of the insulating film 112 and the side walls 116 may be, for example, the average hydrogen concentrations of the insulating film 112 and the side walls 116, respectively, in a certain region. Alternatively, the hydrogen concentrations of the insulating film 112 and the side walls 116 may be, for example, the highest hydrogen concentrations of the insulating film 112 and the side walls 116, respectively. Each hydrogen concentration can be measured by using, for example, Time Of Flight Secondary Ion Mass Spectrometry (TOF-SIMS) or the like.

The quantity of hydrogen needed to terminate the dangling bond in the pixel region 101 may be excessive relative to the quantity of hydrogen needed for the transistor arranged in the peripheral circuit region 102 which is miniaturized as compared with the transistor arranged in the pixel region 101. If excessive hydrogen is supplied to the transistor, the NBTI characteristics, characteristics by a hot carrier, or the like of the transistor may become worse. Therefore, in this embodiment, an insulating film having a lower hydrogen concentration than the insulating film 112 which includes the silicon nitride film 112b functioning as the hydrogen supply film for the pixel region 101 is used for the insulating film 115 serving as the side walls of the gate electrode 108b.

When the side walls 116 are formed, the insulating film 115 arranged above the pixel region 101 may be, for example, etched without being left above the pixel region 101 as in this embodiment. For example, when the side walls 116 are formed from the insulating film 115, the entire surfaces of the pixel region 101 and the peripheral circuit region 102 may be etched back by dry etching without forming the mask pattern 122d. The manufacturing cost of the solid-state image sensor can be reduced by not forming the mask pattern 122d. In this case, the damage to the semiconductor layer 100 in the pixel region 101 can be suppressed by at least partially leaving the insulating film 112 arranged above the pixel region 101 after the side walls 116 are formed.

After the side walls 116 are formed, n-type semiconductor regions 117 which make the source/drain regions in an LDD structure of the transistor in the peripheral circuit region 102 are formed by implanting an impurity by the ion implantation method. If the source/drain regions do not have the LDD structure, the implantation amount of the impurity when the semiconductor region 114 is formed is adjusted as needed, and the semiconductor region 117 may not be formed. Then, a metal such as cobalt or nickel is formed on the semiconductor layer 100 so as to cover the pixel region 101 and the peripheral circuit region 102. The formed metal is made to react with the gate electrode 108b, and the semiconductor regions 114 and 117 in the peripheral circuit region 102, forming metal silicide layers 118 on the surfaces of the gate electrode 108b and the source/drain regions made of the semiconductor regions 114 and 117.

Figure 2D:
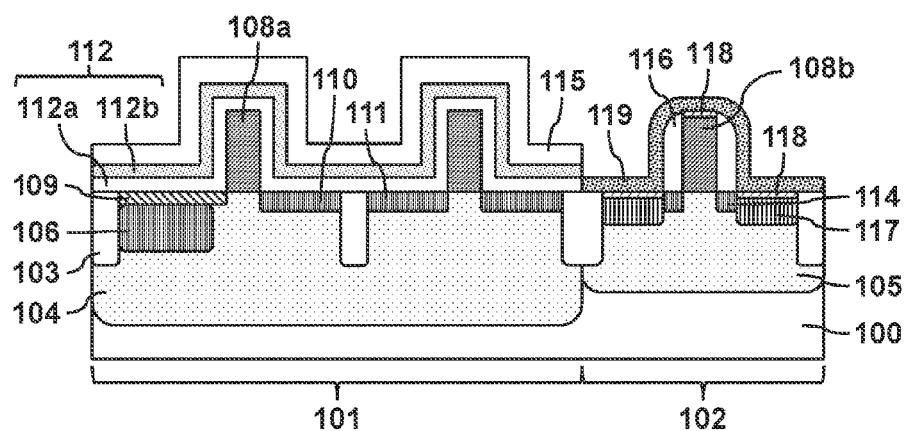

After the metal silicide layers 118 are formed, a silicon nitride film 119 which functions as an etch stopper in the peripheral circuit region 102 is formed above the semiconductor layer 100 so as to cover the pixel region 101 and the peripheral circuit region 102. The silicon nitride film 119 may be formed so as to have a lower hydrogen concentration than the silicon nitride film 112b by using a deposition condition different from that of the silicon nitride film 112b. Then, a mask pattern which covers the peripheral circuit region 102 is formed, and the silicon nitride film 119 arranged above the pixel region 101 is removed by isotropic dry etching. FIG. 2D is the sectional view showing time when the silicon nitride film 119 arranged above the pixel region 101 is etched. The silicon nitride film 119 may be formed on a deposition condition that it functions as a stress liner film of the transistor in the peripheral circuit region 102. In an arrangement shown in FIG. 2D, the silicon nitride film 119 in the pixel region 101 is removed completely. However, the present invention is not limited to this. For example, if a light waveguide is formed above the photoelectric conversion portion, the silicon nitride film 119 may be left in a corresponding portion so as to function as an etching stopper film when an opening portion for arranging the light waveguide in an interlayer insulating film formed on the insulating film 112 is formed.

Figure 2E:
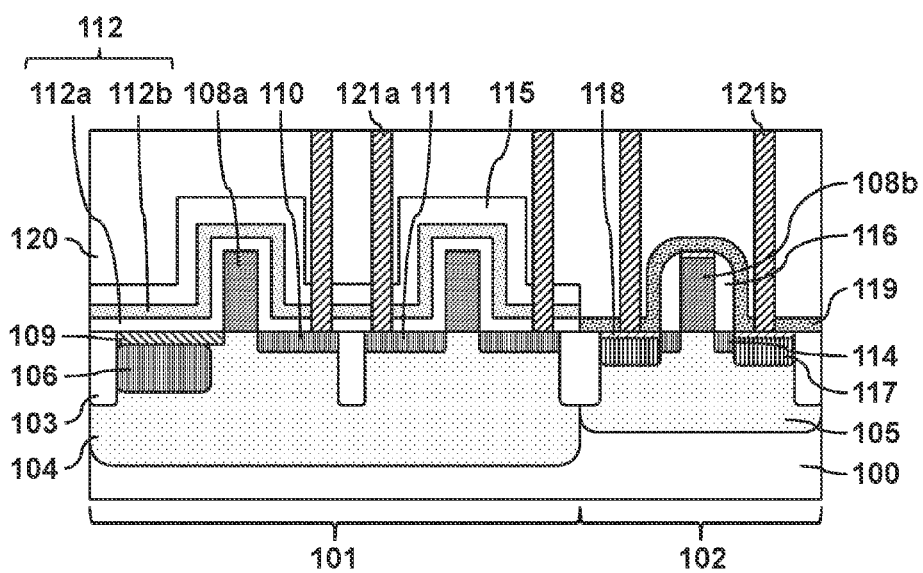

Then, an interlayer insulating film 120 is formed. Silicon oxide such as BPSG, BSG, or PSG deposited by, for example, a high-density plasma CVD method may be used for the interlayer insulating film 120. After the interlayer insulating film 120 is formed, in the pixel region 101, the insulating film 112 is used as an etching stop film, and contact holes for electrically connecting the semiconductor regions 110 and 111, and the gate electrode 108a are formed. For example, anisotropic dry etching may be used to form the contact holes. The contact holes formed in the semiconductor regions 110 and 111 can be formed on the semiconductor regions 110 and 111 by self alignment by causing the insulating film 112 to function as the side walls. After the contact holes are formed, an impurity may be implanted through the opening portions of the contact holes by the ion implantation method such that contact plugs formed in the contact holes, and the semiconductor regions 110 and 111 are electrically connected to each other more reliably. Then, also in the peripheral circuit region 102, the silicon nitride film 119 is used as the etching stop film, and contact holes for electrically connecting the gate electrode 108b and the source/drain regions of the transistor in the peripheral circuit region 102 are formed. As in the case of forming the contact holes in the pixel region 101, the contact holes may be formed by using dry etching. An order in which the contact holes are formed between the pixel region 101 and the peripheral circuit region 102 is not limited to an order in this embodiment. The contact holes may be formed first in the peripheral circuit region 102 or at the same time between the pixel region 101 and the peripheral circuit region 102. Subsequently, electrodes 121a and 121b are formed by filling the contact holes with an electric conductor. FIG. 2E is the sectional view showing the electrodes 121a and 121b formed. After that, a wiring pattern using a metal or the like, a color filter, a microlens, and the like are formed, completing the solid-state image sensor. A hydrogen annealing process for promoting hydrogen supply to the transistors arranged in the pixel region 101 and the peripheral circuit region 102 may be added in the final stage of a step of forming the wiring pattern.

As described above, the gate electrode 108a and the gate electrode 108b are formed from the polysilicon film 107 in different steps between the pixel region 101 and the peripheral circuit region 102. When the gate electrode 108a and the other constituent elements in the pixel region 101 are formed, the peripheral circuit region 102 is covered with the polysilicon film 107. When the gate electrode 108b and the other constituent elements in the peripheral circuit region 102 are formed, the pixel region 101 is covered with the insulating film 112. By using those steps, it becomes possible to suppress the damage to the semiconductor layer 100 in the pixel region 101 and the peripheral circuit region 102 in an etching process when the solid-state image sensor is manufactured. As a result, it is possible to reduce the noise generated in the photoelectric conversion portion in the pixel region 101. It is also possible to suppress the characteristic variations in the transistors arranged in the pixel region 101 and the peripheral circuit region 102, respectively. Further, insulating layers having different arrangements between the insulating film 112 which covers the pixel region 101 and the insulating film 115 which forms the side walls 116 in the peripheral circuit region 102 are formed. The insulating film 112 has the hydrogen concentration higher than that of the side walls 116 formed from the insulating film 115, terminating the dangling bond effectively and reducing the noise in the pixel region 101. Excessive hydrogen supply to the peripheral circuit region 102 is suppressed, making it possible to suppress degradation in the characteristics of the transistor arranged in the peripheral circuit region 102.

The embodiments according to the present invention have been explained above. However, the present invention is not limited to these embodiments, and the aforementioned embodiments can appropriately be modified and combined without departing from the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-073178, filed Mar. 31, 2016 which is hereby incorporated by reference wherein in its entirety.

What is claimed is:

1. A method of manufacturing a solid-state image sensor with a pixel region and a peripheral region, the method comprising:
    depositing a first insulating film above a semiconductor layer to cover a first gate electrode arranged in the pixel region;
    removing the first insulating film formed in the peripheral region, leaving the first insulating film in the pixel region;
    forming a second insulating film above the semiconductor layer after the removing the first insulating film formed in the peripheral region, to cover a second gate electrode arranged in the peripheral region; and
    forming a side wall on a side surface of the second gate electrode by etching the second insulating film.

2. The method according to claim 1, wherein the first insulating film contains an insulator different from the side wall.

3. The method according to claim 1, wherein a hydrogen concentration of the first insulating film is higher than a hydrogen concentration of the side wall.

4. The method according to claim 1, wherein the side wall contain silicon oxide.

5. The method according to claim 1, wherein the first insulating film includes a silicon nitride film.

6. The method according to claim 5, wherein the first insulating film has a stacked structure including the silicon nitride film and a silicon oxide film.

7. The method according to claim 6, wherein the first insulating film is stacked in an order of the silicon oxide film and the silicon nitride film from a side of the semiconductor layer, and
the etching the first insulating film includes isotropic dry etching the silicon nitride film and wet etching the silicon oxide film after etching the silicon nitride film.

8. The method according to claim 5, wherein the silicon nitride film is formed by using a material that contains at least one material selected from the group consisting of dichlorosilane and hexachlorodisilane.

9. The method according to claim 1, wherein in the forming the second gate electrode, the pixel region is covered with a mask pattern.

10. The method according to claim 1, further comprising:
forming source/drain regions in portions of the semiconductor layer adjacent to the second gate electrode after the forming the second gate electrode; and
forming metal silicide on the second gate electrode and the source/drain regions.

11. The method according to claim 1, wherein the second insulating film is formed to cover the first insulating film left in the pixel region.

12. The method according to claim 11, further comprising: forming the first gate electrode; and
forming the second gate electrode, after the forming the first gate electrode.

13. The method according to claim 1, further comprising:
depositing a gate electrode film above the semiconductor layer;
etching the gate electrode film to form the first gate electrode patterned in the pixel region; and
etching the gate electrode film to form the second gate electrode patterned in the peripheral region.

14. The method according to claim 13, wherein the second gate electrode is formed after the first gate electrode is formed.

15. The method according to claim 13, wherein in the etching the gate electrode film to form the first gate electrode, leaving the gate electrode film in the peripheral region, and in the etching the gate electrode film to form the second gate electrode, etching the gate electrode film left in the peripheral region.

16. The method according to claim 15, wherein the second gate electrode is formed after the removing the first insulating film.

17. The method according to claim 1, wherein the second insulating film consist of a silicon oxide film.

18. The method according to claim 10, wherein the forming source/drain regions comprises:
forming a first semiconductor region before the forming the side wall; and
forming a second semiconductor region after the forming the side wall.

19. The method according to claim 1, wherein in the forming the side wall, leaving the second insulating film on the first insulating film.

20. The method according to claim 1, further comprising:
forming a silicon nitride film in the peripheral region to cover the side wall;
forming an interlayer insulating film to cover the first insulating film and the silicon nitride film; and
forming a contact hole in the interlayer insulating film; and
forming an electrode in the contact hole.

* * * * *